United States Patent
Chang et al.

(10) Patent No.: US 6,638,855 B1
(45) Date of Patent: Oct. 28, 2003

(54) METHOD OF FILLING CONTACT HOLE OF SEMICONDUCTOR DEVICE

(75) Inventors: Kyu-hwan Chang, Kyungki-do (KR); Yong-sun Ko, Suwon (KR); Chang-lyong Song, Suwon (KR); Seung-pil Chong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/502,200

(22) Filed: Feb. 10, 2000

(30) Foreign Application Priority Data

Feb. 10, 1999 (KR) .............................................. 99-4681
Jan. 10, 2000 (KR) ................................................ 00-968

(51) Int. Cl.⁷ ........................................ H01L 21/4763
(52) U.S. Cl. ..................... 438/637; 438/618; 438/622; 438/589; 438/597
(58) Field of Search ................................ 438/618, 622, 438/637, 584, 597, 675, 700, 710, 711, 719, 726, 672, 712, 720, 723

(56) References Cited

U.S. PATENT DOCUMENTS

| | | | | |
|---|---|---|---|---|
| 5,266,516 A | * | 11/1993 | Ho | 438/621 |
| 5,305,519 A | * | 4/1994 | Yamamoto et al. | 438/623 |
| 5,306,671 A | * | 4/1994 | Ogawa et al. | 438/595 |
| 5,681,780 A | * | 10/1997 | Mihara et al. | 438/700 |
| 5,939,334 A | * | 8/1999 | Nguyen et al. | 438/689 |
| 5,962,345 A | * | 10/1999 | Yen et al. | 438/709 |
| 6,024,045 A | * | 2/2000 | Kikuchi et al. | 118/723 ME |
| 6,063,300 A | * | 5/2000 | Suzuki et al. | 134/1.1 |
| 6,107,192 A | * | 8/2000 | Subrahmanyan et al. | 438/637 |
| 6,139,700 A | * | 10/2000 | Kang et al. | 204/192.17 |
| 6,149,829 A | * | 11/2000 | Takamatsu et al. | 216/67 |

OTHER PUBLICATIONS

Chang et al, ULSI Technology, McGraw–Hill, 1996, pp. 345–351.*

* cited by examiner

Primary Examiner—Matthew Smith
Assistant Examiner—V. Yevsikov
(74) Attorney, Agent, or Firm—F. Chau & Associates, LLP

(57) ABSTRACT

A method of filling a contact hole of a semiconductor device preceded by dry cleaning for removing a damaged layer resulting from dry etching is provided. The method includes selectively exposing an underlying material layer by a dry etch and dry cleaning including passing plasma excited from a source gas over the exposed underlying material layer to remove the damaged layer formed from the dry etch. Subsequently, an electrically conductive layer with which to fill the contact hole is formed. The formation of the electrically conductive layer is performed in a separate chamber connected sequentially to a chamber for performing the dry cleaning to prevent the exposed underlying material layer inside the dry cleaned contact hole from being exposed to a source of contamination.

13 Claims, 9 Drawing Sheets

METHOD OF FILLING CONTACT HOLE OF SEMICONDUCTOR DEVICE

BACKGROUND OF THE INVENTION

1. Field of the Invention

The present invention relates to fabrication of a semiconductor device and more particularly, to a method of filling a contact hole of a semiconductor device using a dry cleaning process, and to a method of removing a damaged layer resulting from a prior dry etching process.

2. Description of Related Art

As integration density of semiconductor devices increases, cleaning processes therefor become increasingly important. For instance, following a dry etching process for forming a contact hole, it is important that a proper process of cleaning the surface of a semiconductor substrate exposed by the contact hole or the sidewalls thereof prior to a process for filling the contact hole is utilized. Dry etching for patterning is performed in such a way that reactive ions contained in plasma are accelerated using a voltage difference to etch material layers and the like on a semiconductor substrate. Such dry etching process has increased in popularity as the feature sizes of patterns applied to a semiconductor device become more minute. However, such etching process can also induce an ion bombardment effect which in turn results in lattice defect or distortion with regard to the semiconductor substrate underlying the patterned material layer or polycrystalline silicon (polysilicon). Due to the lattice defect or distortion, a damaged layer is formed on a semiconductor substrate exposed by the dry etch. The existence of the damaged layer thus formed may change the electrical properties of the substrate, for example, deteriorate the electrical conductivity.

In order to remove the damaged layer or to compensate for the degradation of electrical properties caused thereby, the following methods are being used. For example, an annealing process or ion implantation process, i.e., plug implantation preceded by formation of an electrically conductive material layer such as a plug with which to fill the contact hole is performed to compensate for the degradation of the electrical properties. Following a dry etching process, in an ashing process for removing a photoresist pattern which acts as an etching mask during a dry etching process, a method of removing an oxide layer created by oxidation of a semiconductor substrate surface by a wet etch can be used. Further, prior to a process of forming a barrier layer below an electrically conductive layer for filling a contact hole, a wet cleaning process or the like can be utilized to prevent degradation of the electrical characteristics of a semiconductor device.

There are disadvantages among the above methods. For example, the annealing process and plug implantation are complicated as well as costly. When a dielectric layer on which a contact hole is formed is made of various kinds of insulating materials having a different wet etch rate, a wet cleaning process may cause defects in the profile of contact hole sidewalls such as embossment. Further, the wet cleaning process is performed independently in a system separated from a vapor deposition system for depositing an electrically conductive material. For example, a cleaned semiconductor substrate is transferred to a single wafer type vapor deposition system, after a wet cleaning process is conducted in a batch type cleaning system such as a wet station. During such transfer, the semiconductor substrate cleaned above will be exposed to the atmosphere, resulting in contamination such as formation of a spontaneous oxide layer or absorption of contaminants. The spontaneous oxide layer and the like can significantly reduce electrical conductivity in a semiconductor device.

SUMMARY OF THE INVENTION

To solve the above problems, it is an objective of the present invention to provide a method of filling a contact hole of a semiconductor device preceded by a dry cleaning process for removing a damaged layer or spontaneous oxide layer formed on a semiconductor substrate or electrically conductive layer exposed by a dry etching process, in situ, thereby preventing the degradation of an electrical feature resulting from recontamination.

A method according to the present invention includes forming a dielectric layer on an underlying material layer, performing a dry etching process for patterning the dielectric layer to form a contact hole exposing the underlying material layer, and performing a dry cleaning process for removing a damaged layer resulting from the contact hole formation by providing the underlying material layer with plasma excited from source gas. The source gas preferably includes oxidative gas and oxide reactive gas.

The dry cleaning preferably includes the use of plasma excited from the source gas comprised of an oxidative gas such as oxygen and a fluoride gas such as trifluoronitrogen. Helium and argon gases can be further included in the source gas. The plasma is further preferably excited from the source gas by microwaves and provided to the underlying material layer by downflowing. At this stage, it is preferable to avoid a process for accelerating the plasma upon application of a voltage difference.

The dry cleaning further includes removing the spontaneous oxide layer, created from removing the damaged layer, by providing an oxide reactive gas to the underlying material layer in which the damaged layer is eliminated. In this case, the oxide reactive gas such as trifluoronitrogen gas is provided to the spontaneous oxide layer together with a hydrogen plasma which can be excited by microwaves and provided thereto by downflowing.

For a subsequent process, the present invention includes the formation of an electrically conductive layer with which to fill the contact hole. The formation of the electrically conductive layer is performed in a separate chamber clustered by being connected sequentially to a chamber for performing the dry cleaning process to thereby prevent the exposed underlying material layer inside the dry cleaned contact hole from being exposed to a source of contamination.

According to the present invention, a damaged layer resulting from dry etching for forming a contact hole can be removed and recontamination of the cleaned inside of a contact hole can be prevented, thereby avoiding increased contact resistance between an electrically conductive layer with which to fill the contact hole and an underlying material layer.

BRIEF DESCRIPTION OF THE DRAWINGS

The above objective and advantage of the present invention will become more apparent by describing in detail a preferred embodiment thereof with reference to the attached drawings in which.

DETAILED DESCRIPTION OF PREFERRED EMBODIMENTS OF THE INVENTION

Figure 1:
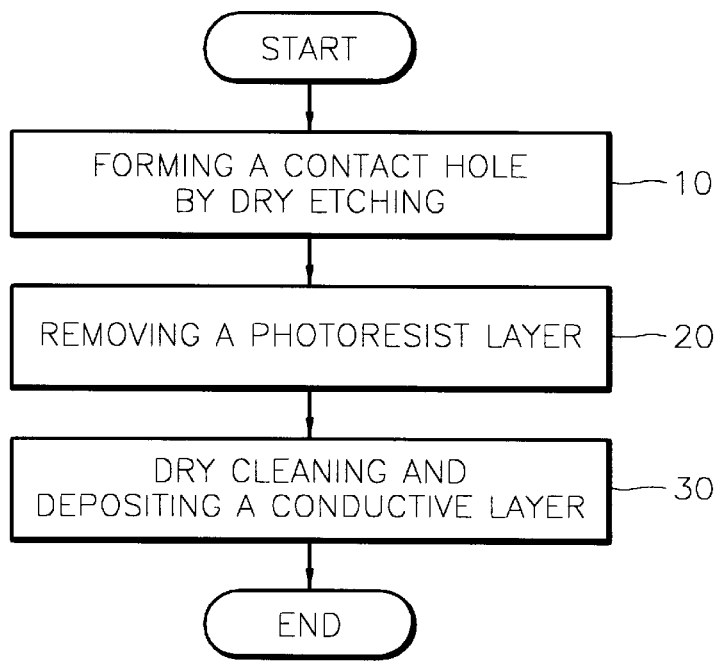
FIG. 1 is a flowchart showing a method for filling a contact hole of a semiconductor device according to a preferred embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers is exaggerated for clarity, and the same reference numerals in different drawings represent the same element. Further, it will be understood that when a layer is referred to as being "on" another layer or substrate, it can be directly on the other layer or substrate, or intervening layers may also be present.

FIG. 1 is a flowchart showing a method for filling a contact hole of a semiconductor device according to a preferred embodiment of the present invention.

A preferred embodiment of the present invention presents a method of dry cleaning the inner part of a contact hole for removing a damaged layer resulting from a dry etch, followed by a process of filling the contact hole with an electrically conductive layer. The illustrative method includes the steps of forming a contact hole by a dry etching process (step 10), removing a residual photoresist layer used as an etching mask in the dry etching process (step 20), and conducting dry cleaning of the contact hole as a pre-process for forming an electrically conductive layer which serves to fill the contact hole (step 30).

The dry cleaning is accomplished by means of a soft etch with the use of plasma, so that the damaged layer resulting from dry etching is removed. The damaged layer is created on an underlying material layer such as the surface of a silicon semiconductor substrate or a conductive polycrystalline silicon (polysilicon) layer mainly by an ion bombardment effect caused by the use of plasma in the dry etching process. The ion bombard effect is known to be induced by the application of a voltage difference which accelerates plasma so as to increase the efficiency of a dry etch. The existence of the damaged layer may degrade the electrical characteristics of a semiconductor device, so preferably it is removed using dry cleaning.

The dry cleaning described above, for example, a soft etch assisted by plasma is accomplished in such a way as to minimize generation of an ion bombardment effect when the damaged layer is eliminated. In other words, a common dry etching process is conducted by accelerating the excited plasma so as to increase the etching effect as much as possible, while a soft etch is performed by not introducing the plasma accelerating process at all or, minimizing the process itself. Preferably, the soft etch is performed without introduction of such a process.

Now, a preferred embodiment of the present invention will be described in more detail with reference to the drawings.

Figure 6:
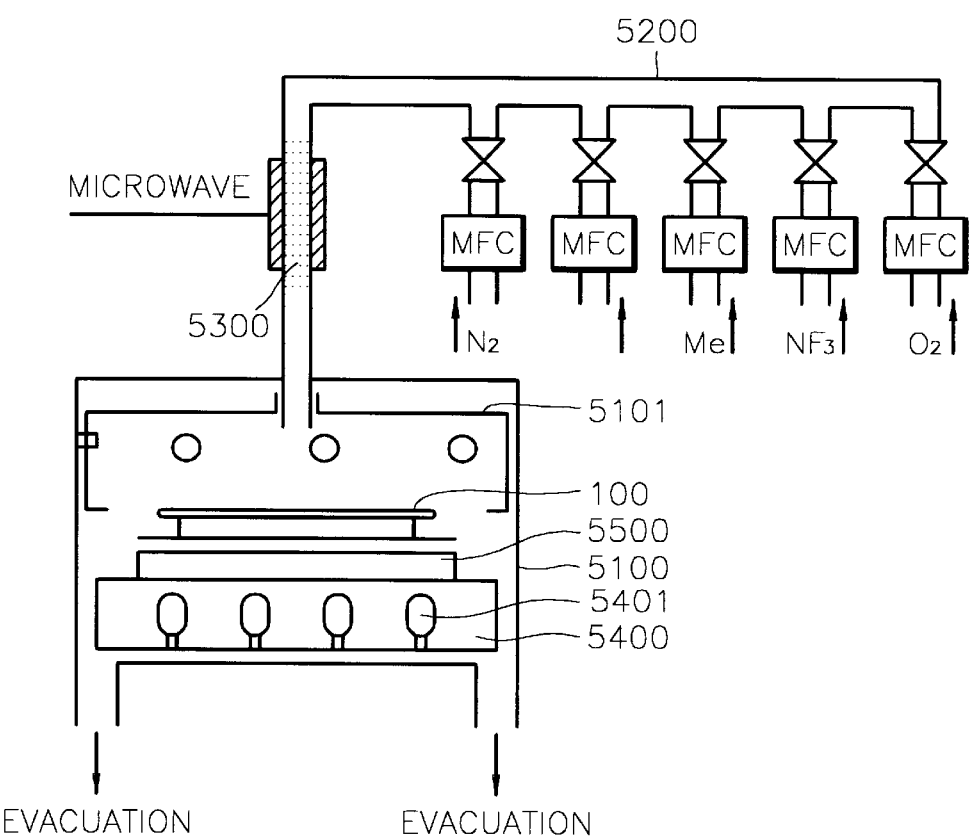
FIGS. 6 and 7 are diagrams showing a dry cleaning module used in a dry cleaning step according to a preferred embodiment of the present invention.
Figure 7:
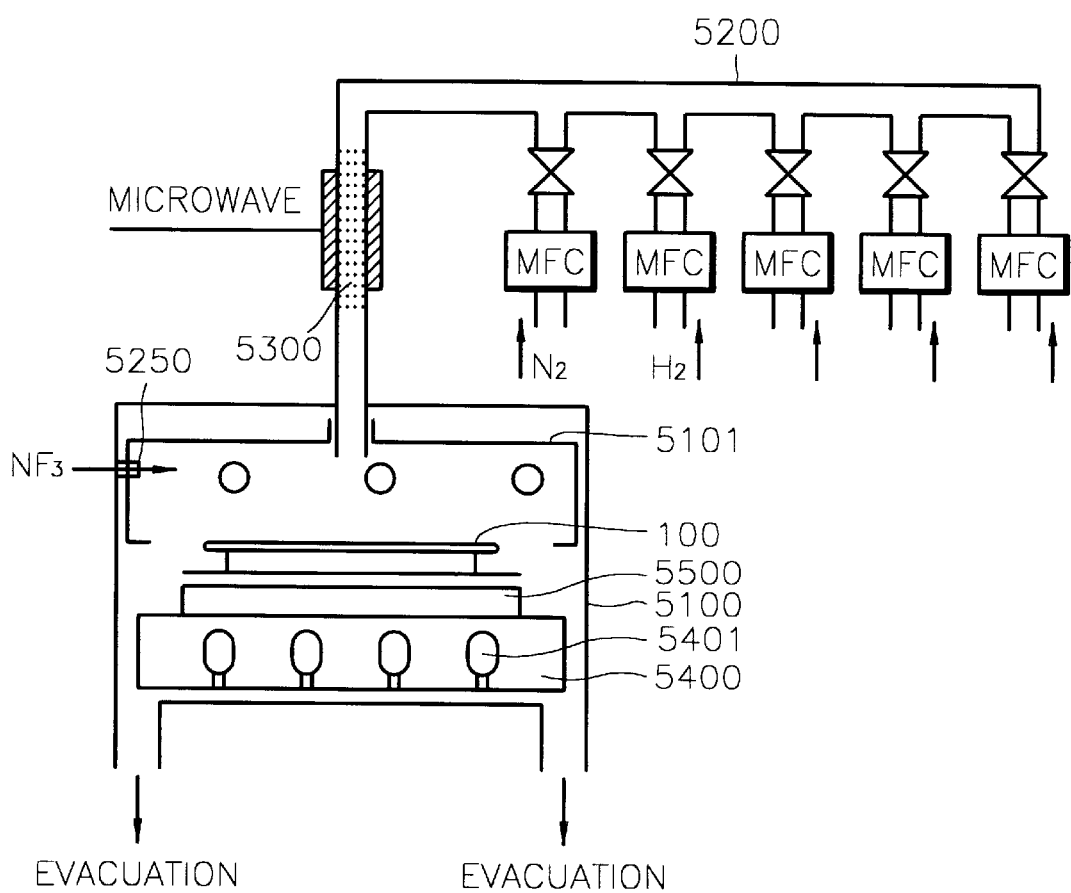
Figure 8:
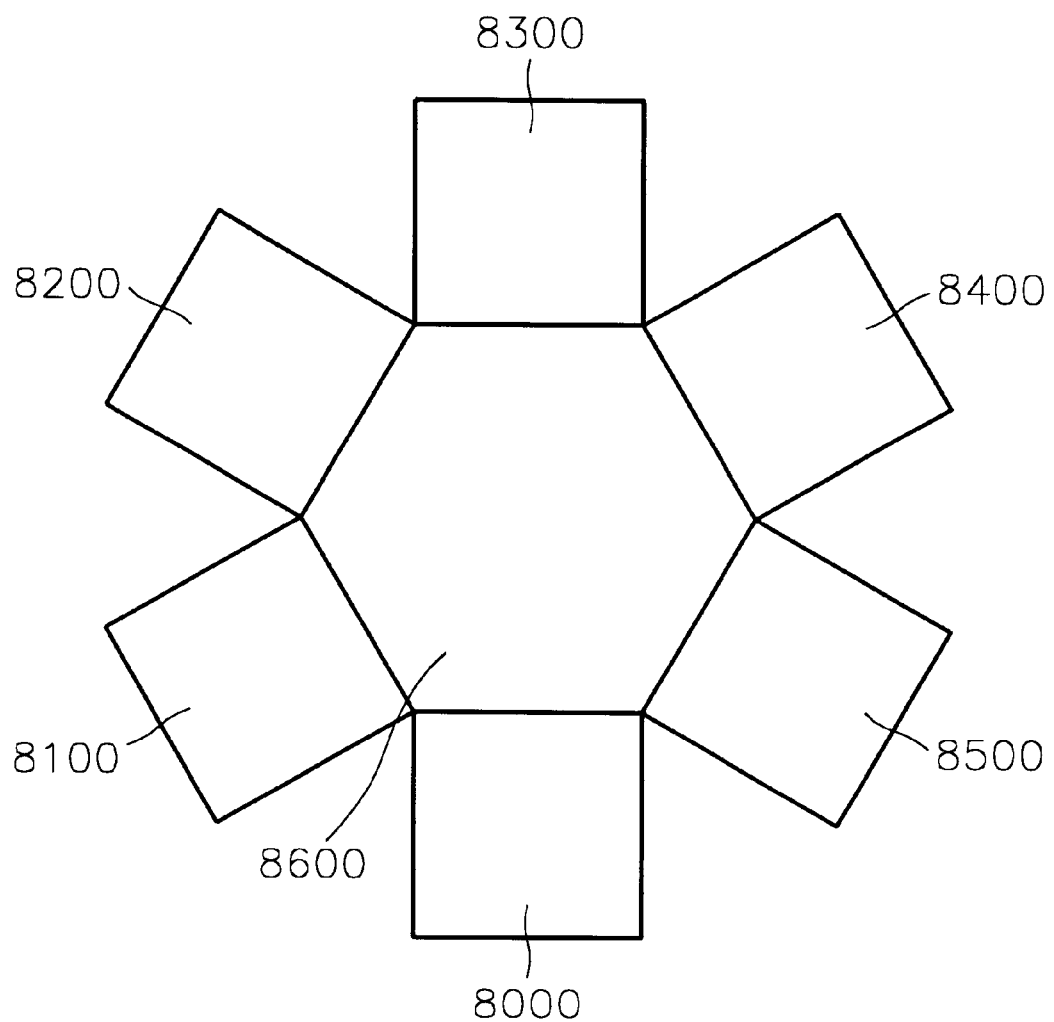
FIG. 8 is a diagram showing the configuration of a cleaning and deposition system including the dry cleaning module shown in FIGS. 6 and 7.

FIGS. 2 through 5 are cross sectional views showing a method for filling a contact hole according to a preferred embodiment of the present invention. FIGS. 6 and 7 are diagrams showing a dry cleaning module used in a dry cleaning step according to a preferred embodiment of the present invention, and FIG. 8 is a diagram showing the configuration of a cleaning and deposition system including the dry cleaning module shown in FIGS. 6 and 7.

Figure 2:
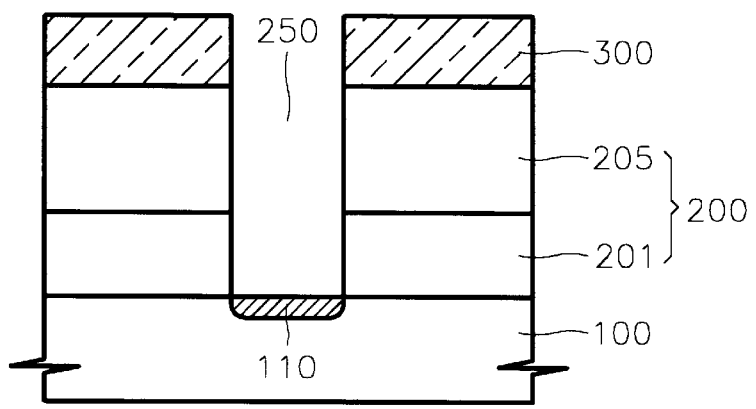
FIGS. 2 through 5 are cross sectional views showing a method for filling a contact hole according to a preferred embodiment of the present invention.

Referring to FIG. 2, after a dielectric layer 200 is formed on a semiconductor substrate, the dielectric layer is patterned using a patterned photoresist layer 300 as an etching mask to form a contact hole 250. This embodiment illustrates the case in which the contact hole 250 exposes the semiconductor substrate 100 made of silicon, but the embodiment is also applicable when the contact hole 250 exposes a polysilicon layer (not shown). Operating elements such as transistor structures (not shown) are previously formed over the semiconductor substrate. The dielectric layer 200 for insulating the operating elements from each other is formed using various kinds of insulating materials.

The dielectric layer 200, if needed, can be formed in a multi-layered structure comprised of several kinds of insulating materials. For instance, the dielectric layer 200 can be formed into a multi-layered structure including a borophosphorous silicate glass (BPSG) layer 201 having a thickness of about 5000 Å and a plasma enhanced tetraethylortho silane (PE-TEOS) layer 205 as first and second dielectric layers, respectively. Such a multilayer-structured dielectric layer is indispensably used for mitigating increasingly higher step difference between layers in more densely integrated semiconductor devices.

After the dielectric layer 200 is formed as described in the foregoing, it is patterned by a photo lithography process, thus forming the contact hole 250 which exposes the underlying semiconductor substrate 100, in which case the patterning process is accomplished using a dry etch. According to the dry etch method, plasma is provided to the dielectric layer 200 and accelerated upon application of a voltage difference, thereby maximizing the etching effect. However, plasma accelerated by a voltage difference can inflict damage on the semiconductor substrate 100 underlying the dielectric layer 200. That is, a damaged layer 110 may result from an ion bombardment effect on the semiconductor substrate 100 exposed by the contact hole 250.

The damaged layer 110 can occur mainly from an ion bombardment effect subsequent to the dry etch since the ion bombardment effect generates the lattice defect or distortion in the vicinity of the semiconductor substrate surface. The existence of the damaged layer 110 is a significant factor in increasing contact resistance in a subsequent process to accordingly deteriorate the electrical properties of the semiconductor device. Therefore, it is preferable to remove the damaged layer 110.

After forming the contact hole 250 as described above, a photoresist layer 300 remaining on the dielectric layer 200 is removed. For example, the semiconductor substrate 100 is transferred sequentially to an asher system and a wet station, so that the residual photoresist layer 300 is eliminated through an ashing and a sulphuric acid strip process. At this stage, an organic residue can stay within the contact hole 250.

Figure 3:
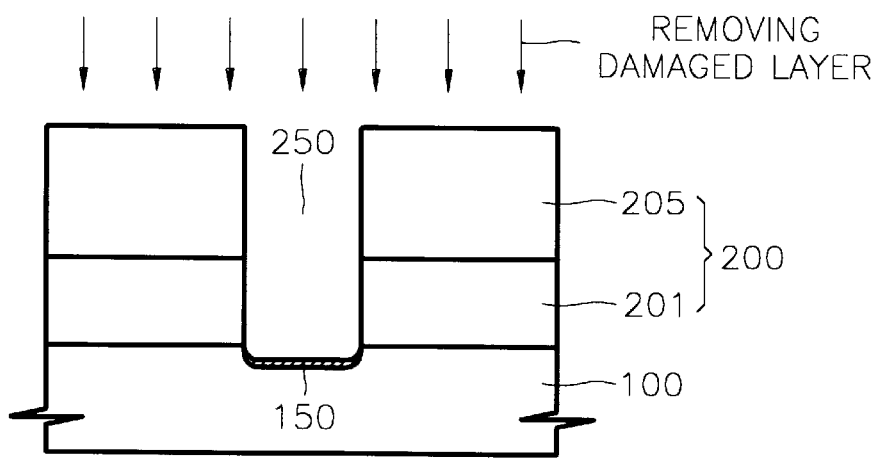

Referring to FIG. 3, the damaged layer 110 created on the semiconductor substrate is removed using a dry cleaning process including a soft etch assisted by plasma. The soft etch mainly exploits the chemical etch action of plasma, i.e. chemically reactive factor of the plasma. Therefore, a physical etching action generated from the application of bias voltage to the rear side of the semiconductor substrate 100 is preferably not performed.

For this purpose, it is preferable that plasma used in a soft etch process is excited remotely and transferred to the semiconductor substrate 100 by downflowing. The soft etch process allows for an induced coupled plasma (ICP), or reactive ion etching (RIE) in which control conditions such as power applied to excite plasma and plasma source gas supply or the like are adjusted.

A soft etch for the dry cleaning can be performed using a plasma system including a remote plasma module as shown in FIG. 6. The flowing plasma source gas is excited to a plasma state by microwaves, and the plasma is flown down to the semiconductor substrate 100. Such plasma oxidizes the damaged layer 110 to selectively remove it from an undamaged semiconductor substrate 100. In this case, the plasma contains oxidative radicals for oxidizing the damaged layer 110, preferably, oxide-removing radicals for eliminating the oxidized damaged layer 110. The plasma, for example, may be excited from a plasma source gas including oxidative gas for oxidizing silicon forming a damaged layer, and oxide reactive gas for generating oxide removing radical such as fluoride gas. Oxygen gas ($O_2$) can be introduced as oxidative gas, and fluoronitrogen such as trifluoronitrogen ($NF_3$) or fluorocarbon such as tetrafluorocarbon ($CF_4$), as fluoride gas. In a preferred embodiment of the present invention the trifluoronitrogen is used as an example. Inert gases such as helium (He) or Argon (Ar) can be further included in the plasma source gas.

Referring to FIG. 6, plasma source gas is provided through a first lead-in tube 5200 to a chamber 5100, in which the semiconductor substrate is loaded, by the control of mass flow controller (MFC) and excited to a plasma state by microwaves supplied in this course. For example, trifluoronitrogen, oxygen, and helium are provided in the range of about 30–130 standard cubic centimeters per minute (sccm), 50–1,000 sccm, 10–1,000 sccm, respectively. Preferably, the trifluoronitrogen, oxygen, and helium are provided at a flow rate of about 35, 70, 500 sccm, respectively. In addition to the plasma source gas, nitrogen is further provided at a flow rate of about 10–1,000 sccm.

Plasma 5300 remotely excited from the plasma source gas is introduced into the chamber 5100 flows downward toward the semiconductor substrate 100. A quartz shield 5101 is installed in the chamber 5100 into which the plasma 5300 is introduced. The semiconductor substrate 100 is heated by heating lamps 5401 loaded in a heater part 5400 on which a quartz window 5500 is introduced.

The chamber 5100 is evacuated by a turbo mechanical pump and dry pump to be maintained at the pressure of about 0.1–10 torr. Further, the semiconductor substrate 100 is maintained at a temperature of about 5–200° C. Preferably, the pressure is approximately 0.1 torr and the temperature is approximately 40° C. Microwaves are provided at a power of about 500–2,000 W, preferably about 1,000 W. With the above process conditions, a soft etch with the use of plasma can be accomplished for about 100 secs. However, the processing time is dependent upon other conditions for the process.

Meanwhile, the etching rate of the dielectric layer 200 such as silicon forming the semiconductor substrate 100 or polysilicon layer and BPSG layer can be governed by the controlling supply of $NF_3$ and $O_2$ gases used in the step of removing the damaged layer 110. For example, an increase in the supply of $NF_3$ increases the etching rate of both BPSG layer and silicon, while an increase in the supply of $O_2$ reduces the etching rate of silicon.

By relatively controlling the supply ratio of $NF_3$ and $O_2$, the etch rate of silicon to BPSG can be adjusted to be in the range of about 0.53–3.13, preferably about 2 and below. Such control of the etch rate of silicon with respect to BPSG can restrain a BPSG layer 201 exposed on the sidewalls of the contact hole 250 in FIG. 2 from being seriously damaged by a soft etch.

The resulting damaged layer 110 on the semiconductor substrate 100 is removed using a soft etch assisted by the plasma thus provided. The soft etch removes the damaged layer 110 from the exposed semiconductor substrate 100 with a thickness of about 2 to 400 Å, although it is dependent on the process conditions.

The step of removing the damaged layer 110 by the soft etch, as described in the foregoing, can be accomplished by providing plasma excited by microwaves by downflowing. However, as occasion demands, the soft etch can be conducted by means of the ICP or RIE process. For instance, when ICP is used, the soft etch can be performed by generating plasma from a source gas provided at a ratio of 15:10:625 for $NF_3$:$O_2$:He under the conditions that the pressure is about 0.5 torr, the applied power is about 200 W, and the temperature is about 20° C. When the RIE process is applied for the soft etch, it can be performed in a way such that plasma is formed from a source gas provided at a ratio of 5:50:200 for $CF_4$:$O_2$:Ar under the conditions that the pressure is about 150 mtorr, the applied power is about 200 W, and the temperature is about 40° C. When the ICP or RIE process is utilized, it is preferable to perform the soft etch on the condition that plasma damage is minimized or does not actually occur, e.g., the plasma is not accelerated upon application of a voltage difference. In other words, preferably, bias voltage is not applied.

The step of removing the damaged layer 110 may further include the removal of an organic residue resulting from a process of eliminating the photoresist layer 300. That is, an ashing or wet cleaning process for removing the photoresist layer 300 can leave behind the organic component residue inside the contact hole 250, and since plasma contains oxidative radicals such as an oxygen plasma the residue in question reacts with the oxidative radical so as to be removed in a vapor phase.

Further, on the surface of the semiconductor substrate 100 exposed by the removal of the damaged layer 110, a spontaneous oxide layer 150 shown in FIG. 3 can be induced from spontaneous oxidation by the plasma, that is, by the oxygen plasma contained in the plasma. Preferably, the spontaneous oxide layer 150 is removed because it can cause an increased contact resistance and the like.

Figure 4:
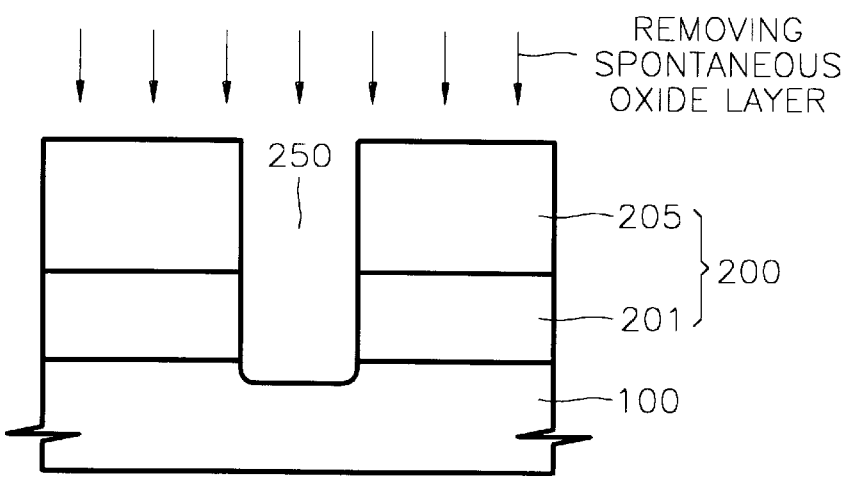

Referring to FIG. 4, the spontaneous oxide layer 150 resulting from the soft etch for removing the damaged layer 110 is taken away. It is desirable that a step of removing the spontaneous oxide layer 150 be performed in situ without breaking vacuum with the step of removing the damaged layer 110. For example, the semiconductor substrate 100 from which the damaged layer 110 has been removed is introduced into the remote plasma module 5100 shown in FIG. 7, and then plasma is introduced onto the semiconductor substrate 100 along with a fluoride gas such as trifluoronitrogen, which acts as an oxide reactant.

The plasma serves to induce the oxide reactant such as trifluoronitrogen to react with the spontaneous oxide layer 150, for example, a plasma can be excited from source gas containing hydrogen and nitrogen gases. Specifically, as shown in FIG. 7, hydrogen and nitrogen gases, the supply ratio of which is controlled by MFC, are provided into the chamber 5100 through the first lead-in tube 5200. In doing so, microwaves are admitted to hydrogen gas to excite the plasma containing hydrogen radicals.

The nitrogen gas and the hydrogen gas can each be provided at a flow rate of about 50–1000 sccm and 50–100 sccm. Preferably, the former and the latter are provided about 400 and 10 sccm, respectively, and plasma is excited, on the way, upon application of power of about 300 W. In addition, trifluoronitrogen is provided to the chamber 5100 through a second lead-in tube 5250 separately installed within the chamber 5100. For example, the trifluoronitrogen is provided at about 1–100 sccm, preferably about 90 sccm in a gas state, thus etching away the spontaneous oxide layer 150. At this stage, the chamber 5100 is maintained at a pressure of 0.01–100 torr, preferably about 3 torr, and the semiconductor substrate is maintained at a temperature of 5–200° C., preferably about 25° C.

The trifluoronitrogen thus provided in conjunction with hydrogen radicals contained in plasma reacts with silicon oxide ($SiO_x$) of which the spontaneous oxide layer 150 is formed. More specifically, the trifluoronitrogen reacts with hydrogen radicals to produce an intermediate reactant such as hydro-trifluoronitrogen radicals ($NF_3H^*$) which in turn react with silicon oxide to create a vapor phase byproduct such as hexafluorosilicon nitride ($N_2SiF_6$) and an aqueous vapor, thereby removing the spontaneous oxide layer 150. The created reactant byproduct in a vapor phase is removed from the chamber 5100 by evacuation. In order to remove such byproduct, an annealing process including purging and pumping can be performed in situ at a temperature of about 150° C. for about 1 minute, following the step of removing the spontaneous oxide layer 150.

The step of removing the spontaneous oxide layer 150 can be accomplished in about 3 minutes. Under the above conditions for removing the spontaneous oxide layer 150, an etch rate of about 2 Å/min can be achieved. Thus, the spontaneous oxide layer, which has a thickness of about 2–400 Å, is completely removed by adjusting the process time and the like. With such removal of the spontaneous oxide layer 150 the decontaminated and cured surface of the semiconductor substrate 100 is exposed. A process for removing the spontaneous oxide layer 150 can be accomplished in situ sequentially in a chamber where a process for eliminating the damaged layer 110 occurs. In other words, after a process of removing the damaged layer 110 is conducted in the chamber 5100 shown in FIG. 6, a process of pumping and purging the inside of the chamber 5100 can be performed as a middle step, followed by a step of removing the spontaneous oxide layer 150 with hydrogen plasma and trifluoronitrogen provided as described above.

A dry cleaning module for removing the spontaneous layer 150, if needed, is installed separately as shown in FIG. 7, and connected with a dry cleaning module for performing a process of removing the damaged layer 110, allowing the semiconductor substrate 100 to be transferred in sequence without breaking the vacuum. By removing the damaged layer 110 and the resulting spontaneous oxide layer 150 in situ, the step of conducting a dry cleaning within the contact hole 250 can be achieved.

Figure 5:
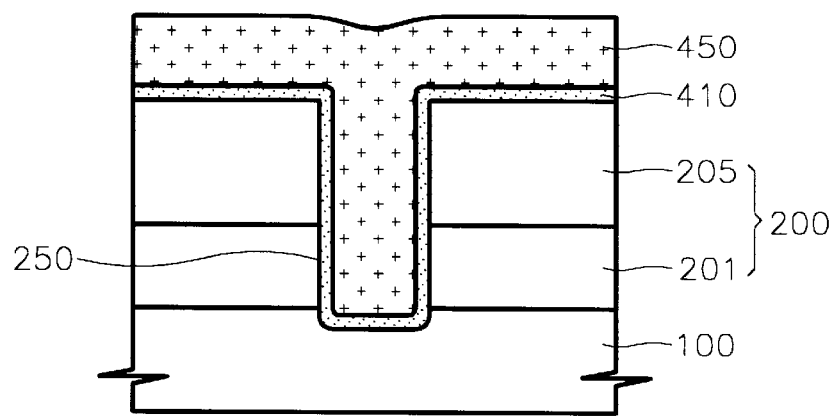

Referring to FIG. 5, an electrically conductive layer 450 is formed for filling a dry cleaned contact hole 250. For example, a tungsten film can be formed on the semiconductor substrate 100 which is exposed by the contact hole 250 and utilized as the electrically conductive layer 450. The electrically conductive layer 450 can be formed by chemical vapor deposition (CVD) or sputtering. Additionally, a barrier layer 410 underlying the electrically conductive layer 450 can be introduced onto the interface with the semiconductor substrate 100 for preventing diffusion.

A step of forming the electrically conductive layer 450 can be performed without breaking the vacuum, along with a dry cleaning process including the steps of removing the damaged layer 110 and the spontaneous oxide layer 150. For example, as shown in FIG. 8, after the dry cleaning process is carried out in a chamber of a dry cleaning module 8100, the semiconductor substrate 100 is transferred sequentially to a chamber of a vapor deposition module 8200 which is connected to the dry cleaning module 8100. In this case, the semiconductor substrate 100 is transferred through a transfer module 8600 which is maintained in a vacuum state or in an inert gas atmosphere so as to prevent the exposure of the semiconductor substrate 100 to a source of contamination such as an oxidizing atmosphere. To put it in other way, forming the electrically conductive layer without breaking the vacuum with the dry cleaning process can prevent recontamination for the dry cleaned semiconductor substrate 100.

To perform the steps of removing the damaged layer 110 and the spontaneous oxide layer 150 and the step of forming the electrically conductive layer 450 without breaking the vacuum, as shown in FIG. 8, a cleaning and vapor deposition system can be utilized in which the dry cleaning module 8100 and a plurality of vapor deposition modules 8200, 8300, 8400 and 8500 for depositing the electrically conductive layer 450 and the diffusion barrier layer 410 form a cluster. The dry cleaning module 8100 can be structured as shown in FIG. 6 or 7, and with regard to the vapor deposition modules 8200, 8300, 8400 and 8500, a common single wafer type CVD or sputtering system can be employed.

The dry cleaning module 8100 and the vapor deposition modules 8200, 8300, 8400 and 8500 are installed around a central transfer module 8600, and the semiconductor substrate 100 can be transferred sequentially by means of a robot arm (not shown) installed in the transfer module 8600. Additionally, the transfer module 8600 is connected to a load lock chamber module 8000 for loading or unloading the semiconductor substrate 100 on or from the cleaning and vapor deposition system. The transfer module 8600 and the load lock chamber module 8000 can be maintained in the vacuum state, so that the dry cleaning step and the formation step for the electrically conductive layer 450 will proceed without breaking the vacuum.

Now, the effectiveness of the illustrative preferred embodiment of the present invention will be described in more detail.

Figure 9:
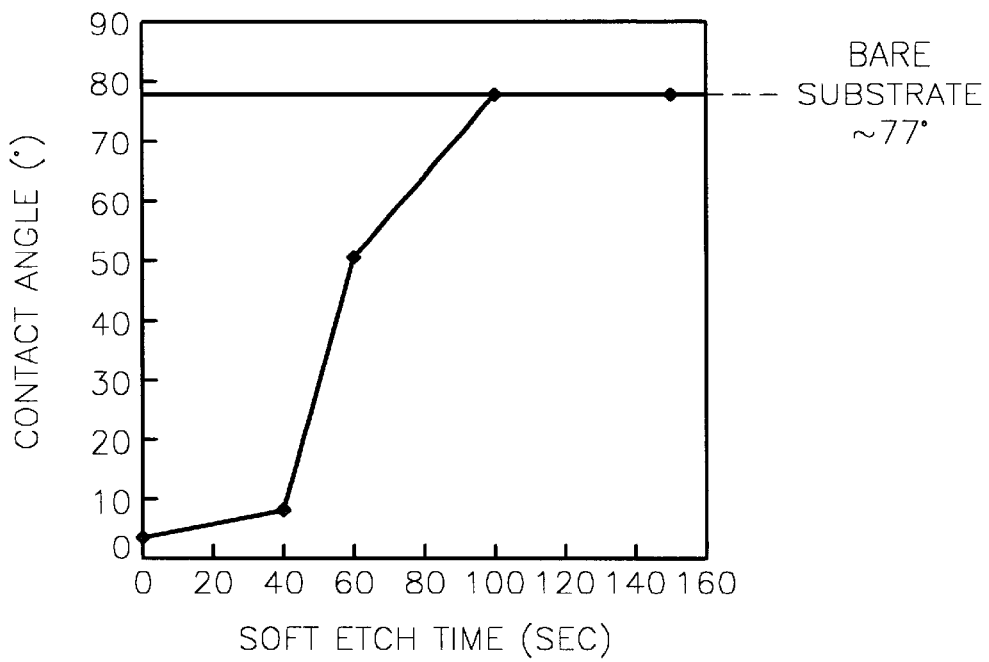
FIG. 9 is a graph showing contact angles measured on the surface of a semiconductor substrate on which a damaged layer is removed using the dry cleaning process according to a preferred embodiment of the present invention.

FIG. 9 is a graph showing contact angles measured on the surface of a semiconductor substrate from which the damaged layer has been removed by the dry cleaning process according to the above-described embodiment of the present invention. After the damaged layer created as a result of contact hole formation is removed by the soft etch assisted by plasma as explained referring to FIG. 3, the effectiveness for removing the damaged layer was examined by way of measuring contact angles on the exposed semiconductor substrate surface. In this case, a soft etch was accomplished at a pressure of about 0.7 torr, at an applied microwave power of 1,100 W, at a temperature of 40° C., and at a supply ratio of 35:70:500 for $NF_3:O_2:He$. Subsequently to remove the damaged layer by the soft etch, as explained referring to FIG. 4, the spontaneous oxide layer was removed using $NF_3$ gas and hydrogen plasma.

In general, a contact angle is used as a means of measuring the surface state of material layers. When a liquid falls onto a material layer, the contact angle means the angle between the surface of the material layer and the surface of a liquid phase according to the state of the material layer surface. In the case of a bare semiconductor substrate without damage or contamination, a contact angle is generally known to be about 77°. However, where a semiconductor substrate is contaminated or damaged, a contact angle is known to be reduced. According to the graph shown in FIG.

9, the damaged layer is completely removed with a soft etch for about 100 secs. In contrast, it can be seen from FIG. 10 that it is not easy to remove the damaged layer with conventional wet cleaning.

Figure 10:
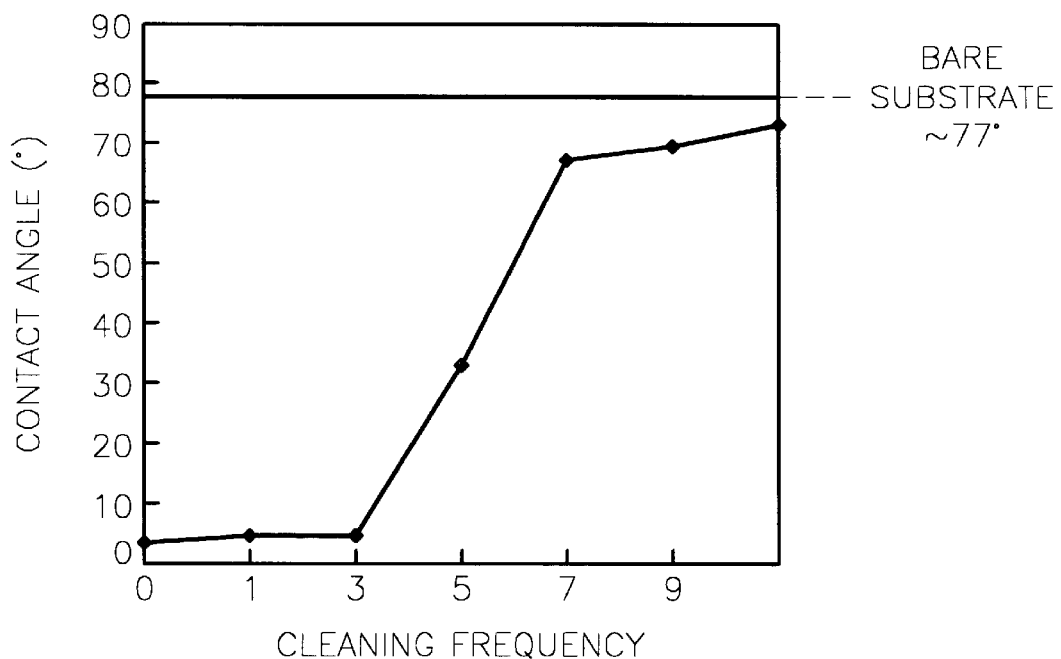
FIG. 10 is a graph showing contact angles measured on the surface of a semiconductor substrate on which a damaged layer is removed using a wet cleaning process.

FIG. 10 is a graph showing contact angles measured on the surface of a semiconductor substrate with the damaged layer removed by a wet cleaning. In this case, the wet cleaning process was accomplished using SC-1 cleaning solution, and for a subsequent process, a spontaneous oxide layer was removed using HF solution diluted at a ratio of 200:1. The contact angles were measured on the surface of the semiconductor substrate thus processed. SC-1 cleaning solution is a common mixture of $NH_4OH$, $H_2O_2$, and $H_2O$. The wet cleaning using the SC-1 was performed for about 10 minutes at a time.

As the wet cleaning was repeated many times, the contact angles tended to increase with the number of wet cleanings, up to about 77°, i.e., the contact angle measured on a bare substrate was eventually obtained through repeating the cleaning process 7–9 times. The results shown in FIG. 10 indicate that the damaged layer is difficult to completely remove from the surface of the semiconductor substrate using the wet cleaning process. Given the results of FIGS. 9 and 10, it can be found that a soft etch according to the illustrative preferred embodiment of the present invention has removed the damaged layer more effectively than the conventional wet cleaning. As shown in FIG. 9, when a soft etch according to the present invention is performed for 100 secs., the contact angle equivalent to that in the bare substrate surface can be derived. This shows that the damaged layer can be removed completely in the case of a dry cleaning process including the soft etch according to the present invention. Conversely, if wet cleaning is performed using SC-1 as shown in FIG. 10, it is not easy to cure the damage up to the bare substrate level even if cleaning is performed for more than 90 minutes.

Figure 11:
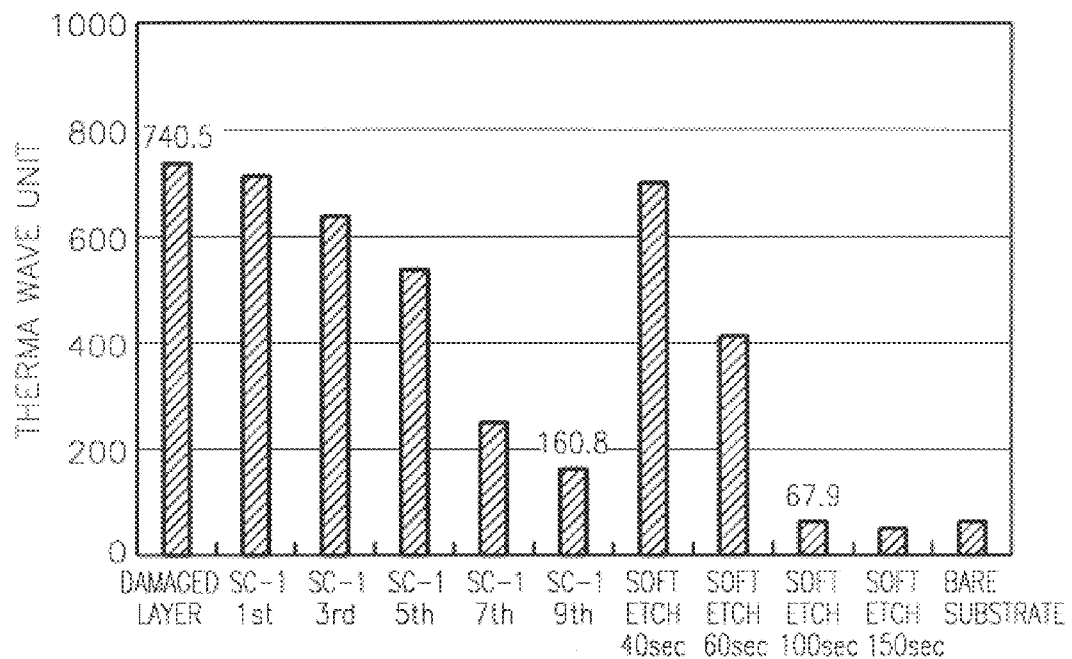
FIG. 11 is a bar graph showing therma wave units measured by a therma wave measurement method.

The above effect is further illustrated by the measurement of therma wave shown in FIG. 11. Therma wave measurement is a method of indicating the surface state by a therma wave unit, and a bare substrate in a pure surface state has a low therma wave unit. In contrast, as damage to or contamination of substrates increases, the measured therma wave unit is higher.

FIG. 11 is a bar graph showing therma wave units derived from the therma wave measurement in which case the measured samples are prepared under the same conditions as in FIGS. 9 and 10. According to the results of FIG. 11, when a soft etch is performed for about 100 secs., the therma wave unit at this time is significantly reduced to the bare substrate level. In contrast, even when wet cleaning is repeated 9 times using SC-1, the corresponding therma wave unit is higher than that of the bare substrate, which means that the damaged layer has still not been removed.

Additionally, in the former case, the surface of the semiconductor substrate is etched away by about 330 Å while it is etched by about 270 Å in the latter case. To correlate this with the measurements of the therma wave units and contact angles, it can be seen that the soft etch process according to an embodiment of the present invention can more completely remove the damaged layer.

Further, if a dry cleaning process is performed including the soft etch according to a preferred embodiment of the present invention, damage to profile of the contact hole can be prevented. Generally, a dielectric layer forming a contact hole has a multi-layered structure in which a plurality of sub-dielectric layers comprised of various kinds of insulating materials are overlapped. Accordingly, the plurality of dielectric layers may each have a different etch rate when they are contacted with cleaning solutions used in the conventional wet cleaning process. The wet etch extent for various kinds of material layers to different kinds of chemical solutions is presented in Table 1 below.

TABLE 1

| | Classified wet etch quantity (Å) of dieletric layer | | | | | | | |
|---|---|---|---|---|---|---|---|---|
| Class | SC-1 70° C. 10 min | SC-1 50° C. 10 min | 100:1 HF 60 sec | 200:1 HF 90 sec | 1000:1 HF 20 min | LAL200 1 min | LAL500 1 min | Phosphoric acid 1 min |
| Thermal oxide layer (vapor deposition) | 15 | 3 | 35 | 26 | 9 | 218 | 590 | 1.2 |
| thermal oxide layer (ion implantation) | 19 | — | 50 | 27 | — | 285 | 651 | — |
| USG (vapor deposition) | 82 | 10 | 204 | 175 | 44 | 1518 | 4348 | 6 |
| HTO (vapor deposition) | 53 | 22 | 91 | 82 | 24 | 520 | 1292 | 4.3 |
| BPSG | 427 | 102 | 313 | 273 | 111 | 314 | 571 | 48 |
| LP-SiN$_x$ | — | — | — | — | — | — | — | 65 |
| N-Poly | 32 | 6 | 5 | 2 | — | 8 | 8 | 1.5 |
| D-Poly | 49 | 8 | 3 | 3 | — | — | 4 | 1.8 |
| PE-TEOS (vapor deposition) | 58 | 7 | 103 | 96 | 32 | 774 | 1916 | — |
| PE-TEOS (annealing) | 35 | 7 | 66 | 59 | 12 | 445 | 1160 | — |
| P-SiH$_4$ | 98 | 32 | 270 | 262 | 126 | 1402 | 2561 | 10.5 |
| HDP oxide layer | 33 | 6 | — | 88 | — | — | — | 2.7 |
| SiON | 83 | 21 | 55 | 60 | 47 | 125 | 158 | 345 |
| Flowable oxide layer | 65 | — | 144 | 96 | — | 753 | 1753 | — |
| WSi$_x$ | 271 | 83 | 5 | 2 | — | — | — | — |

As indicated in Table 1, the insulating materials have different etch quantity for each kind of cleaning solution. Usually, the multi-overlapped dielectric layers are exposed along the sidewalls of the contact hole. Thus, if conventional wet cleaning is used, the exposed dielectric layers have a different etch quantity, and the profile of the contact hole sidewall will likely be deteriorated.

For example, in the event that a dielectric layer formed by overlapping a PE-TEOS layer on a BPSG layer is patterned to make a contact hole, the BPSG and the PE-TEOS layers may have a great difference in etching quantity as shown in FIG. 1. Thus, if wet cleaning is performed using SC-1 followed by a 200:1 diluted HF dip, the sidewall profile default such as creation of a reentrant profile may occur on the sidewall of the contact hole, which can cause failure in filling the contact hole in a subsequent process of forming an electrically conductive layer. An example of this is a scanning electron microscope (SEM) photo shown in FIG. 12.

Figure 12:
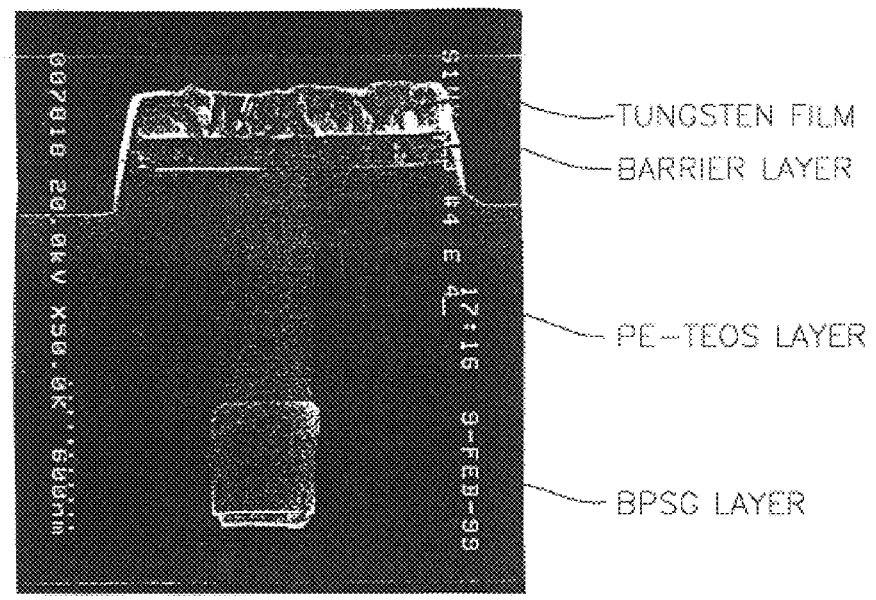
FIG. 12 is an SEM photo showing transformation of the profile of a contact hole according to wet cleaning.

FIG. 12 is an SEM photo showing transformation of the contact hole profile according to wet cleaning. When a wet cleaning is performed using SC-1 and for a subsequent process a dip into HF solution diluted at a ratio of 200:1 is made for about 30 secs., the section of a structure coated with the diffusion barrier layer and tungsten film was examined using the SEM. In this case, a dielectric layer employs a structure in which BPSG layer with a thickness of about 5,000 Å is formed, and then PE-TEOS layer with a thickness of about 10,000 Å is formed on the underlying BPSG layer. As shown in FIG. 12, a reentrant profile is created on the sidewall of the contact hole in a portion where the BPSG layer is formed. This results from the fact that the wet etch rate of the BPSG layer is predominantly in excess of that of PE-TEOS.

Figure 13:
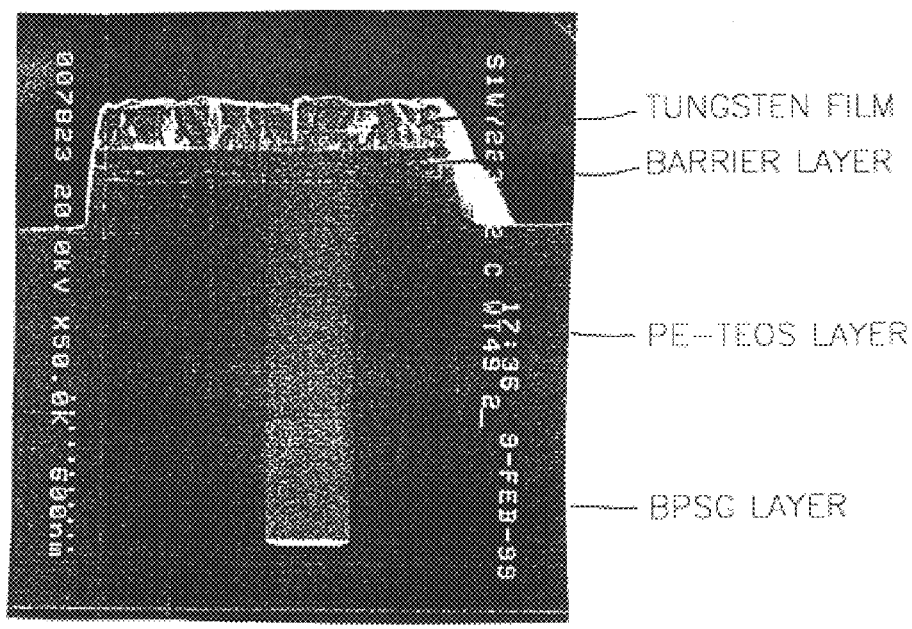
FIG. 13 is an SEM photo showing the profile of a contact hole undergoing the dry cleaning process according to a preferred embodiment of the present invention.

On the other hand, in the case of dry cleaning according to a preferred embodiment of the present invention, it shows a meager difference in etch quantity for each insulating material. This is further shown by another SEM photo in FIG. 13. In FIG. 13, which is an SEM based photo showing the profile of a contact hole which has undergone dry cleaning according to a preferred embodiment of the present invention, a dielectric layer employs a structure in which a BPSG layer with a thickness of about 5,000 Å is formed, and then a PE-TEOS layer with a thickness of about 10,000 Å is formed on the underlying BPSG layer. It can be found that the transformation of the contact hole profile is actually suppressed.

Figure 14:
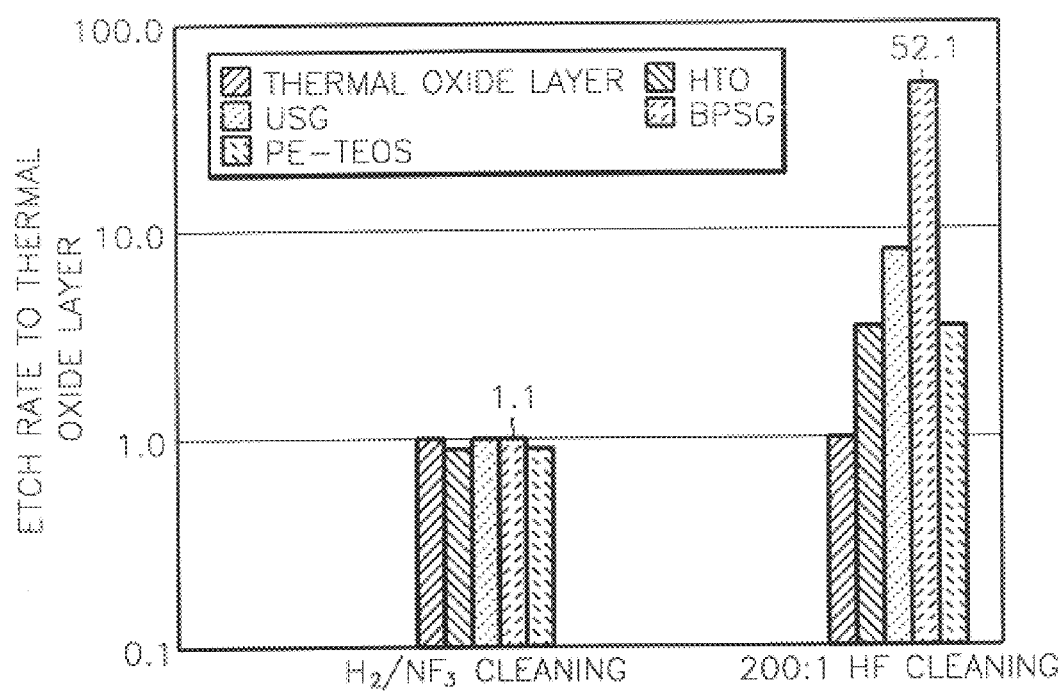
FIG. 14 is a bar graph showing the relative etch rates of various kinds of insulating materials to a thermal oxide layer.

The advantages of the present invention can be seen from FIG. 14. FIG. 14 is a bar graph showing the relative etch rate of various kinds of insulating materials to a thermal oxide layer. Referring to FIG. 14, when dry cleaning process is performed in such a way as to remove the damaged layer using the soft etch according to a preferred embodiment of the invention and to remove the spontaneous oxide layer using $H_2$ and $NF_3$ gases, the insulating materials represent almost constant etch rates regardless of their difference, i.e., about 1 Å/min relative to the thermal oxide layer.

Conversely, in the case of wet cleaning using a conventional SC-1 and 200:1 diluted HF solution, there is a wide difference between the relative etch rates of the insulating materials to the thermal oxide layer. The BPSG layer, in particular, can be etched away 52. 1 times as much as the thermal oxide layer, while the PE-TEOS has an etch rate which is relatively lower than that of the BPSG layer. For this reason, if a dielectric layer comprised of BPSG and PE-TEOS layers is used as shown in FIG. 12, the BPSG layer can be predominately etched away compared to the other which results in the creation of a reentrant profile in the sidewall of the contact hole, i.e., a defect in the profile of the contact hole sidewall. However, if dry cleaning is used according to a preferred embodiment of the invention, the profile of the sidewall of the contact hole can remain intact, which prevents the occurrence of failure in filling the contact hole with an electrically conductive layer.

Figure 15:
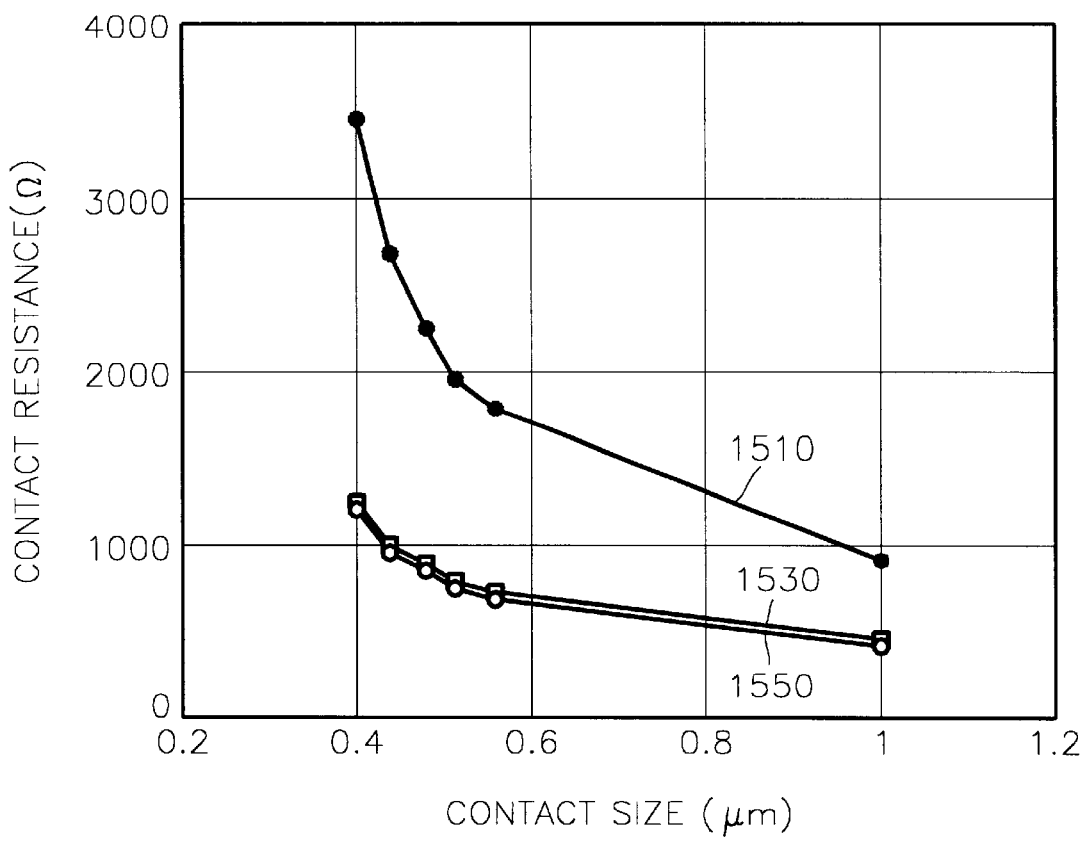
FIG. 15 is a graph showing the effect of contact resistance reduction by a method of filling the contact hole according to a preferred embodiment of the present invention.

Further, according to a preferred embodiment of the present invention, the increase of contact resistance can be restricted as shown in FIG. 15 which shows the effect of reducing the contact resistance by a method of filling the contact hole according to a preferred embodiment of the invention. Specifically, after the contact hole which underwent a wet cleaning by SC-1 and 200:1 diluted HF solution was filled with an electrically conductive layer, contact resistance was measured, and the result thereof is illustrated in a graph 1510. In this case, a tungsten film was used as the electrically conductive layer, and the contact resistance was calculated as the average value per cell.

In addition, for the purpose of comparison, in the event of performing wet cleaning with SC-1 followed by a process of removing the spontaneous oxide layer according to a preferred embodiment of the invention, the measurement result was illustrated in a graph 1530. Further, with regard to dry cleaning according to the present invention including a soft etch and a process of removing the spontaneous oxide layer, the measurement result was illustrated in a graph 1550. These graphs represent the variations of contact resistance according to a contact size.

As indicated in FIG. 15, the graph 1550 according to the present invention shows a contact resistance which is even lower than the contact resistance shown by the graph 1510 according to the wet cleaning. The graph 1530 illustrating the result measured, when a process of removing the spontaneous oxide layer according to the present invention was performed subsequent to wet cleaning by SC-1, also represents a relatively lower contact resistance, which demonstrates that the process for removing the spontaneous oxide layer is very effective.

While this invention has been particularly shown and described with reference to a preferred embodiment thereof, it will be understood by those skilled in the art that various changes and other embodiments in form and details may be made therein without departing from the spirit and scope of the invention as defined by the appended claims.

What is claimed is:

1. A method for filling a contact hole in a semiconductor device comprising the steps of:

forming a dielectric layer on an underlying material layer;

patterning the dielectric layer by dry etching to form a contact hole exposing the underlying material layer;

removing a damaged layer resulting from the formation of the contact hole by a first dry cleaning process, the first dry cleaning process being performed using one of an ICP process and an RIE process, wherein the first dry cleaning process includes passing plasma excited from a source gas over the exposed underlying material layer, said source gas includes oxygen, trifluoronitrogen, and helium if the ICP process is used and said source gas includes $CF_4$, $O_2$, Ar if the RIE is used;

removing a spontaneous oxide layer produced on the exposed underlying material by the plasma of the oxygen, trifluoronitrogen, and nitrogen, by a second dry cleaning process, wherein the second dry cleaning process includes passing trifluoronitrogen and/or hydrogen plasma over the exposed underlying material layer; and forming an electrically conductive layer with which to fill the contact hole.

2. The method of claim 1, wherein forming the electrically conductive layer is performed in sequence with said step of removing the spontaneous oxide layer in connected chambers to avoid exposure of the contact hole from an external source of contamination.

3. The method of claim 1, wherein the second dry cleaning is performed in situ without breaking a vacuum provided in the first dry cleaning process.

4. The method of claim 1, wherein forming the electrically conductive layer is performed without breaking a vacuum in removing the spontaneous oxide layer.

5. The method of claim 1, wherein the source gas further includes one of helium gas and argon gas.

6. The method of claim 1, wherein the plasma is excited from the source gas by microwaves and provided to the damaged layer by downflowing.

7. The method of claim 1, wherein the ICP process is performed by generating plasma from a source gas provided at a ratio of 15:10:625 for $NF_3:O_2:He$.

8. The method of claim 1, wherein the RIE process is performed by generating plasma from a source gas provided at a ratio of 5:50:200 for $CF_4:O_2:Ar$.

9. A method of filling a contact hole of a semiconductor device, comprising the steps of:

forming the contact hole by dry etching;

first dry cleaning said contact hole by passing plasma excited from a source gas over an exposed underlying material layer to remove a damaged layer formed from the dry etching, the first dry cleaning being performed using one of an ICP process and an RIE process, wherein the source gas includes oxygen, trifluoronitrogen, and helium if the first dry cleaning is performed using an ICP process and said source gas includes $CF_4$, $O_2$, Ar if the first dry cleaning is performed using an RIE;

second dry cleaning to remove a spontaneous oxide layer resulting from the first dry cleaning, wherein the second dry cleaning process includes passing trifluoronitrogen and/or hydrogen plasma over the exposed underlying material layer; and and forming an electrically conductive layer in said contact hole.

10. The method of claim 9, wherein said steps of first dry cleaning, second dry cleaning, and forming an electrically conductive layer are performed in adjoining chambers.

11. The method of claim 10, wherein said steps of first dry cleaning, second dry cleaning, and forming an electrically conductive layer are performed without a vacuum break.

12. A method for filling a contact hole of a semiconductor device comprising the steps of:

forming a dielectric layer on an underlying material layer;

patterning the dielectric layer by dry etching to form a contact hole exposing underlying material layer;

first dry cleaning for providing plasma excited from a source gas to the exposed underlying material layer to remove a damaged layer resulting from the formation of the contact hole, the first dry cleaning being performed using one of an ICP process and an RIE process, wherein the source gas includes $NF_3$, $O_2$, and He if the first dry cleaning is performed using an ICP process and said source gas includes $CF_4$, $O_2$, Ar if the first dry cleaning is performed using an RIE;

second dry cleaning to remove a spontaneous oxide layer resulting from the first dry cleaning, wherein the second dry cleaning process includes passing trifluoronitrogen and/or hydrogen plasma over the exposed underlying material layer;

and forming an electrically conductive layer with which to fill the contact hole, wherein the formation of the electrically conductive layer is performed in a separate chamber clustered by being connected sequentially to a chamber for performing the second dry cleaning to prevent the exposed underlying material layer inside the dry cleaned contact hole from being exposed to a source of contamination.

13. The method of claim 1, wherein the hydrogen plasma is excited by microwaves and provided to the spontaneous oxide layer by downflowing.

* * * * *